United States Patent
Paolino et al.

(10) Patent No.: US 10,593,410 B2
(45) Date of Patent: Mar. 17, 2020

(54) READING CIRCUIT AND METHOD FOR A NON-VOLATILE MEMORY DEVICE

(71) Applicant: STMicroelectronics S.r.l., Agrate Brianza (IT)

(72) Inventors: Carmelo Paolino, Palermo (IT); Antonino Conte, Tremestieri Etneo (IT); Anna Rita Maria Lipani, Termini Imerese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/145,734

(22) Filed: Sep. 28, 2018

(65) Prior Publication Data

US 2019/0108886 A1    Apr. 11, 2019

(30) Foreign Application Priority Data

Oct. 11, 2017    (IT) .................. 102017000114539

(51) Int. Cl.

| G11C 16/06 | (2006.01) |
|---|---|
| G11C 16/28 | (2006.01) |
| G11C 16/04 | (2006.01) |
| G11C 16/24 | (2006.01) |
| G11C 7/06 | (2006.01) |

(Continued)

(52) U.S. Cl.
CPC .............. *G11C 16/28* (2013.01); *G11C 7/065* (2013.01); *G11C 7/08* (2013.01); *G11C 13/004* (2013.01); *G11C 16/0408* (2013.01); *G11C 16/24* (2013.01); *G11C 13/0061* (2013.01); *G11C 2013/0042* (2013.01); *G11C 2013/0045* (2013.01); *G11C 2013/0054* (2013.01); *G11C 2207/063* (2013.01)

(58) Field of Classification Search
CPC ... G11C 13/004; G11C 16/0408; G11C 16/24; G11C 16/28; G11C 7/065; G11C 7/08; G11C 13/0061; G11C 2013/0042; G11C 2013/0045; G11C 2013/0054; G11C 2207/063
USPC .................................................... 365/185.21
See application file for complete search history.

(56) References Cited

U.S. PATENT DOCUMENTS

| 9,698,765 B1 * | 7/2017 | La Rosa ............... H03K 5/003 |
| 2007/0176638 A1 | 8/2007 | Park |

(Continued)

FOREIGN PATENT DOCUMENTS

EP    3174200 A1    5/2017

*Primary Examiner* — Hoai V Ho
(74) *Attorney, Agent, or Firm* — Slater Matsil, LLP

(57) ABSTRACT

A sense-amplifier circuit can be used with a non-volatile memory device having a memory array with memory cells arranged in word lines and bit lines and coupled to respective source lines. The circuit has a first circuit branch and a second circuit branch, which receive on a respective first comparison input and second comparison input, during a reading step of a datum stored in a memory cell, a cell current from the bit line associated to the memory cell and a reference current, from a reference bit line in a differential reading operation or from a current-reference generator in a single-ended reading operation. The first and second circuit branches generate, during the datum-reading step, a first output voltage and a second output voltage, as a function of the difference between the cell current and the reference current.

20 Claims, 12 Drawing Sheets

(51) Int. Cl.
*G11C 7/08* (2006.01)
*G11C 13/00* (2006.01)

(56) References Cited

U.S. PATENT DOCUMENTS

2012/0274382 A1* 11/2012 Ucciardello ..... H03K 3/356113
 327/333
2013/0279237 A1* 10/2013 Huang ................ G11C 13/004
 365/148
2019/0103145 A1* 4/2019 Tseng ...................... G11C 7/12

* cited by examiner

READING CIRCUIT AND METHOD FOR A NON-VOLATILE MEMORY DEVICE

CROSS-REFERENCE TO RELATED APPLICATIONS

This application claims priority to Italian Patent Application No. 102017000114539, filed on Oct. 11, 2017, which application is hereby incorporated herein by reference.

TECHNICAL FIELD

The present invention relates to a reading circuit and a reading method for a non-volatile memory device.

BACKGROUND

As is known, and as is illustrated schematically in FIG. 1, a non-volatile memory device, designated as a whole by 1, for example of a flash type, generally comprises a memory array 2 made up of a plurality of memory cells 3, arranged in rows (word lines, WL), and columns (bit lines, BL). The memory array 2 is further in general divided into a plurality of sectors, each comprising respective word lines and bit lines.

Each memory cell 3 is constituted by a storage element, for example formed by a floating-gate transistor, with a gate terminal designed to be connected to a respective word line WL, a first conduction terminal (in particular the drain terminal) that is designed to be coupled to a respective bit line BL, and a second conduction terminal (in particular, the source terminal) that is connected to a reference-potential line (defined as source line, SL). The gate and source terminals of the memory cells 3 of a same word line WL are further electrically connected to one another.

A column-decoder circuit 4 and a row-decoder circuit 5 enable selection, on the basis of address signals received at the input (generated in a per se known manner and designated as a whole by Add), of memory cells 3, and in particular of the corresponding word lines WL and bit lines BL, each time selected, enabling biasing thereof at appropriate voltage and current values during memory operations.

The column-decoder circuit 4, in particular, provides a read path, designed to create a conductive path between the bit lines BL of the memory array 2 each time selected and a sense-amplifier circuit 10, which is designed to compare the current circulating in the addressed memory cell 3 to be read (the so-called direct memory cell), with a reference current in order to determine the value of the datum stored. This reference current may be generated by an appropriate current generator, in the case of so-called single-ended reading, or else by a reference memory cell (the so-called complementary memory cell), associated to a respective reference or complementary bit line BL', physically or logically adjacent in the same memory array 2, in the case of a so-called differential reading.

It is known, for example, that verify operations, subsequent to programming operations, envisage reading of a single-ended type of the data that have been programmed in the memory cells, whereas operations of effective reading of the data stored generally envisage reading of a differential type.

SUMMARY

The present invention relates to a reading circuit and a reading method for a non-volatile memory device. For example, the method can include precharging of the bit lines and obtain improved electrical performance.

One embodiment provides a sense-amplifier circuit that can be used with a non-volatile memory device having a memory array with memory cells arranged in word lines and bit lines and coupled to respective source lines. The circuit includes a first circuit branch and a second circuit branch, designed to receive, at a first comparison input and a second comparison input, respectively, during a reading step of a datum stored in a memory cell, a cell current from the bit line associated to the memory cell and a reference current, from a reference bit line associated to a complementary memory cell in a differential reading operation or from a current-reference generator in a single-ended reading operation. The first circuit branch and the second circuit branch are configured to generate, during the datum-reading step, a first output voltage and a second output voltage at a first output terminal and, respectively, at a second output terminal, as a function of the difference between the cell current and the reference current. The circuit also includes a current-injection module configured to cause an injection of current into the source line associated to the memory cell and to the complementary memory cell that is substantially uniform in the differential and in the single-ended reading operations.

Another embodiment provides a method for reading a non-volatile memory device provided with a memory array with memory cells arranged in word lines and bit lines and coupled to respective source lines. During a reading step of a datum stored in a memory cell, a cell receives current from the bit line associated to the memory cell and a reference current, from a reference bit line associated to a complementary memory cell in a differential reading operation or from a current-reference generator in a single-ended reading operation. During the datum-reading step, a first output voltage and a second output voltage are generated as a function of the difference between the cell current and the reference current. A current is injected into a source line associated to the memory cell and to the complementary memory cell, the current being substantially uniform in the differential and single-ended reading operations.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION OF ILLUSTRATIVE EMBODIMENTS

As will now be discussed in detail, an aspect of the present solution envisages introduction, in each circuit branch of the sense-amplifier circuit, of a current-injection module, configured to cause a substantially uniform injection of current into the source line SL, both during the differential operating mode and during the single-ended operating mode, thus preventing the differences highlighted previously in the value of the cell current $I_{cell}$ to occur in the different operating modes.

Figure 1:
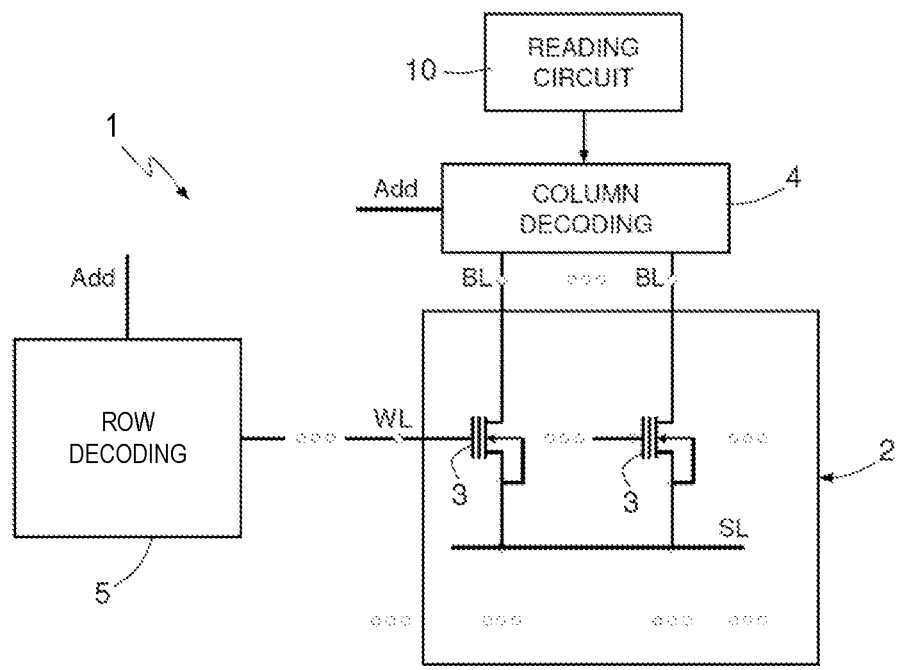
FIG. 1 shows a general block diagram of a non-volatile memory device.
Figure 2:
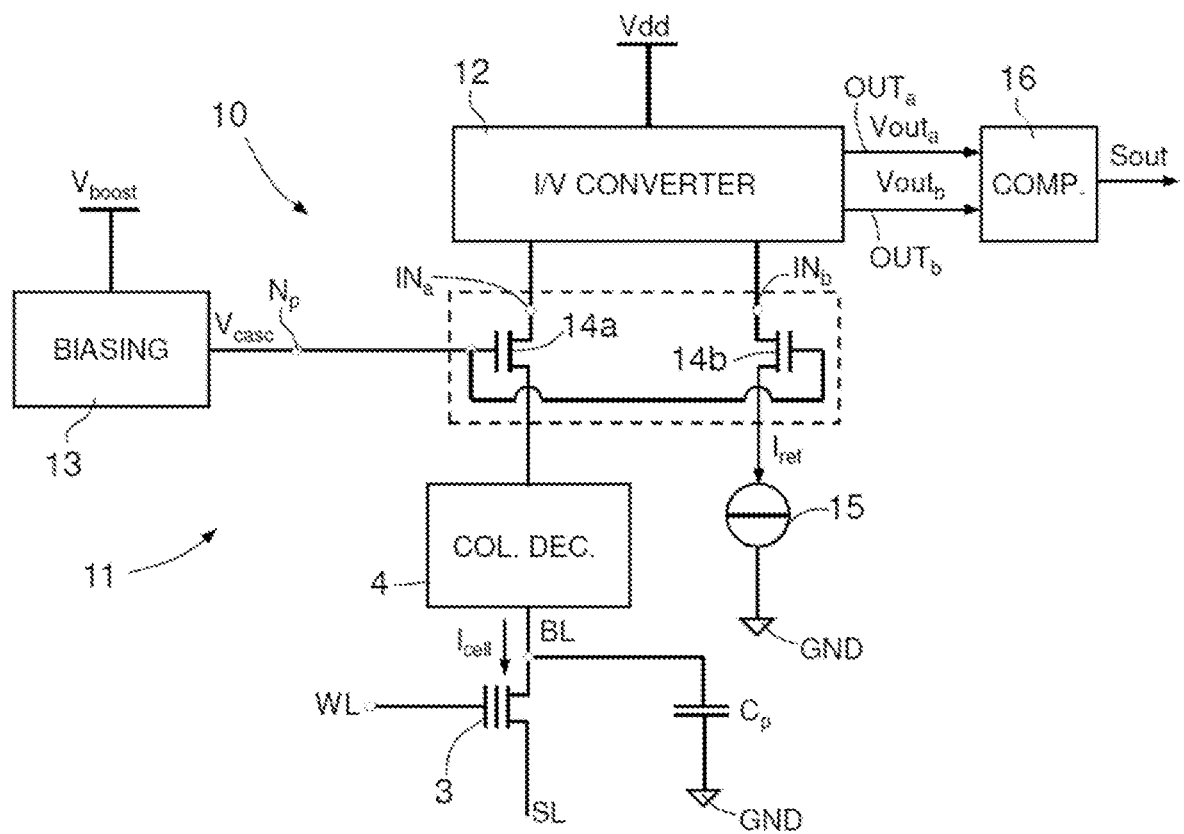
FIG. 2 shows a simplified block diagram of a reading circuit of the non-volatile memory device.

FIG. 2 illustrates a sense amplifier 10 that can be used with the memory of FIG. 1. The sense-amplifier circuit 10 in general comprises a biasing stage 11 and a current-to-voltage (I/V) converter stage 12.

The biasing stage 11 is designed to bias the bit lines BL of the memory array 2 and in turn comprises a biasing generator 13, and a pair of biasing transistors 14a, 14b, of an nMOS type, in the so-called cascode configuration.

The biasing generator 13 receives at its input a boosted voltage $V_{boost}$, for example from a charge-pump voltage-booster stage, and generates at its output a biasing voltage $V_{case}$ on a biasing node $N_p$. Alternatively, and as a function of the value that it is desired to obtain for the biasing voltage $V_{case}$, the biasing generator 13 may receive a supply voltage $V_{dd}$, of a logic value (lower than the boosted voltage $V_{boost}$).

A first biasing transistor 14a of the pair has a first conduction terminal coupled, via the column decoder 4, to the bit line BL selected, from which it receives a cell reading current $I_{cell}$, and a second conduction terminal connected to a first comparison input $IN_a$ of the current-to-voltage converter stage 12. In turn, the second biasing transistor 14b of the pair has a respective first conduction terminal, coupled, through the column decoder 4, to a current-reference generator 15 (or, alternatively, to a reference cell, and to the respective first or second comparison input $IN_a$, $IN_b$, a corresponding bit line BL', in a way not illustrated herein), from which it receives a reference reading current $I_{ref}$, and a second conduction terminal connected to a second comparison input $IN_b$ of the current-to-voltage converter stage 12.

The control terminals of the biasing transistors 14a, 14b are both connected to the aforesaid biasing node $N_p$ so as to receive the biasing voltage $V_{case}$ and consequently impose a maximum allowed value for the voltages on the respective bit line BL, BL', preventing any possible stress and damage during reading.

The current-to-voltage converter stage 12 further has a supply input, on which it receives the supply voltage $V_{dd}$, and is configured to carry out a comparison between the value of the cell reading current $I_{cell}$ and the value of the reference reading current $I_{ref}$, and to generate, based on the result of the comparison, a first output voltage $V_{outa}$ and a second output voltage $V_{outb}$ having complementary values on a first output $OUT_a$ and a second output $OUT_b$, respectively.

The sense-amplifier circuit 10 further comprises a comparator stage 16, which receives at the input the first and second output voltages $V_{outa}$, $V_{outb}$ from the current-to-voltage converter stage 12 and generates, on the basis of the comparison between the same voltages, a digital output signal $S_{out}$, which is indicative of the value of the datum stored in the memory cell 3.

FIG. 2 also shows a parasitic line capacitor $C_p$, electrically coupled between the respective bit line BL and a ground reference GND, representing the capacitive load of the same bit line BL (likewise, a corresponding parasitic line capacitor is coupled to the bit line BL', in the case of differential reading).

During operation, reading of the data stored in the memory cells 3 envisages a first step of precharging of the corresponding bit line BL (and possibly of the reference bit line BL'), which enables charging of the parasitic capacitances $C_p$, $C_p'$ coupled to the bit lines BL, BL' and thus equalization of the voltages of the same bit lines BL, BL'; the reading operation subsequently envisages a step of effective reading of the datum stored, with detection of the cell reading current $I_{cell}$ and comparison with the reference reading current $I_{ref}$ in order to generate an unbalancing of the output voltages $V_{outa}$, $V_{outb}$ and, via the comparator stage 16, of the digital output signal $S_{out}$.

For instance, if the cell reading current $I_{cell}$ is higher than the reference reading current $I_{ref}$, the digital output signal $S_{out}$ may have a high logic value '1', whereas otherwise, i.e., if the cell reading current $I_{cell}$ is lower than the reference reading current $I_{ref}$, the digital output signal $S_{out}$ may have a low logic value '0'.

Figure 3:
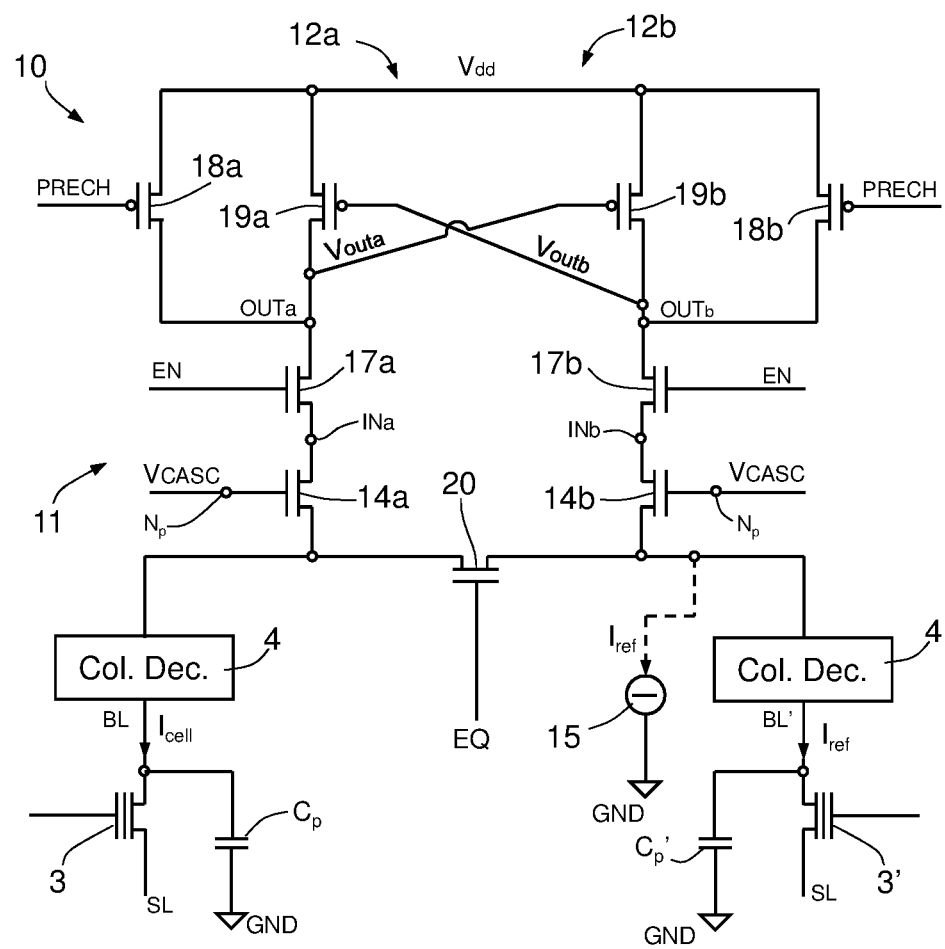
FIG. 3 shows a first circuit implementation, of a known type, of the reading circuit.

With reference to FIG. 3, a first embodiment of a known type of the reading circuit 10 is now described, and in particular of the corresponding current-to-voltage converter stage 12, referred in this case to a differential type reading between a direct memory cell 3, associated to a bit line BL, and a complementary memory cell 3', associated to a respective bit line BL' (as shown in FIG. 3, the current-reference generator 15 for generation of the reference current $I_{ref}$ could alternatively be present).

The current-to-voltage converter stage 12 comprises one circuit branch 12a, 12b for each of the bit lines BL, BL', and each circuit branch 12a, 12b comprises:

an access transistor 17a, 17b, in the example of an nMOS type, having a first conduction terminal connected to the respective first or second comparison input $IN_a$, $IN_b$, a second conduction terminal connected to a respective first or second output terminal $OUT_a$, $OUT_b$, on which it supplies the first and second output voltages $V_{outa}$, $V_{outb}$, and a control terminal, which receives an enable signal EN;

a precharging transistor 18a, 18b, in the example of a pMOS type, having a first conduction terminal connected to the first or second output terminal $OUT_a$, $OUT_b$, a second conduction terminal connected to the supply input, from which it receives the supply voltage $V_{dd}$, and a control terminal, which receives a precharging signal PRECH; and a latch transistor 19a, 19b, in the example of a pMOS type, having a first conduction terminal connected to the first output terminal $OUT_a$, respectively, to the second output terminal $OUT_b$, a second conduction terminal connected to the supply input, from which it receives the supply voltage $V_{dd}$, and a control terminal connected to the second output terminal $OUT_b$, respectively, to the first output terminal $OUT_a$ (i.e., to the output terminal of the other circuit branch).

The latch transistors 19a, 19b of the first and second circuit branches 12, 12' jointly implement a latch block aimed at holding at the output a voltage representative of the datum stored, during reading of the memory cell 3.

The current-to-voltage converter stage 12 further comprises a coupling transistor 20, in the example of an nMOS type, which couples the first conduction terminal of the first biasing transistor 14a to the respective first conduction terminal of the second biasing transistor 14b of the biasing stage 11, and has a control terminal, which receives an equalization signal EQ.

In use, during the first precharging step, the precharging signal PRECH is low, so as to close the precharging transistors 18a, 18b, the enable signal EN is high, so as to close the access transistors 17a, 17b, and the equalization signal EQ is low so that the coupling transistor 20 is open. In this way, a precharge current path is determined, starting from the supply voltage $V_{dd}$, through the precharging transistors 18a, 18b, the access transistors 17a, 17b, and the biasing transistors 14a, 14b, which set the voltage on the bit lines BL, BL' for precharging of the parasitic capacitances $C_p$, $C_p'$ coupled to the bit lines BL, BL'.

Next, during the equalization step, the precharging signal PRECH switches to the high value so as to open the precharging transistors 18, and the equalization signal EQ switches to the high value so that the coupling transistor 20 will switch to the closed state, thus enabling charge sharing between the parasitic capacitances $C_p$, $C_p'$ coupled to the bit lines BL, BL'.

Then, during the step of effective reading, the equalization signal EQ switches again to the low value, thus opening the coupling transistor 20.

Assuming that the cell current $I_{cell}$ is higher than the reference current $I_{ref}$, a progressive reduction of the voltage on the first circuit branch 12a thus occurs, in particular on the first output terminal $OUT_a$, such as to cause closing of the latch transistor 19b of the second circuit branch 12b (and passage of current through the same second circuit branch 12b). Consequently, the second output terminal $OUT_b$ of the second circuit branch 12b switches to the supply voltage $V_{dd}$, thus determining maintenance of the opening condition of the latch transistor 19a of the first circuit branch 12a. The latch block in this way latches the first output voltage $V_{outa}$ at the low value and the second output voltage $V_{outb}$ at the high value, enabling discrimination of the value of the datum stored (for example, the digital output signal $S_{out}$ thus goes to the high logic value, '1').

In a similar way, if the cell current $I_{cell}$ is lower than the reference current $I_{ref}$ there is a progressive reduction of the voltage on the second circuit branch 12b, which in this case leads to closing of the latch transistor 19a of the first circuit branch 12a (with corresponding passage of current through the same first circuit branch 12a) and an opposite unbalancing of the latch block, which brings the first output voltage $V_{outa}$ to the high value and the second output voltage $V_{outb}$ to the low value (for example, the digital output signal $S_{out}$ in this case goes to the low logic value, '0').

Figure 4:
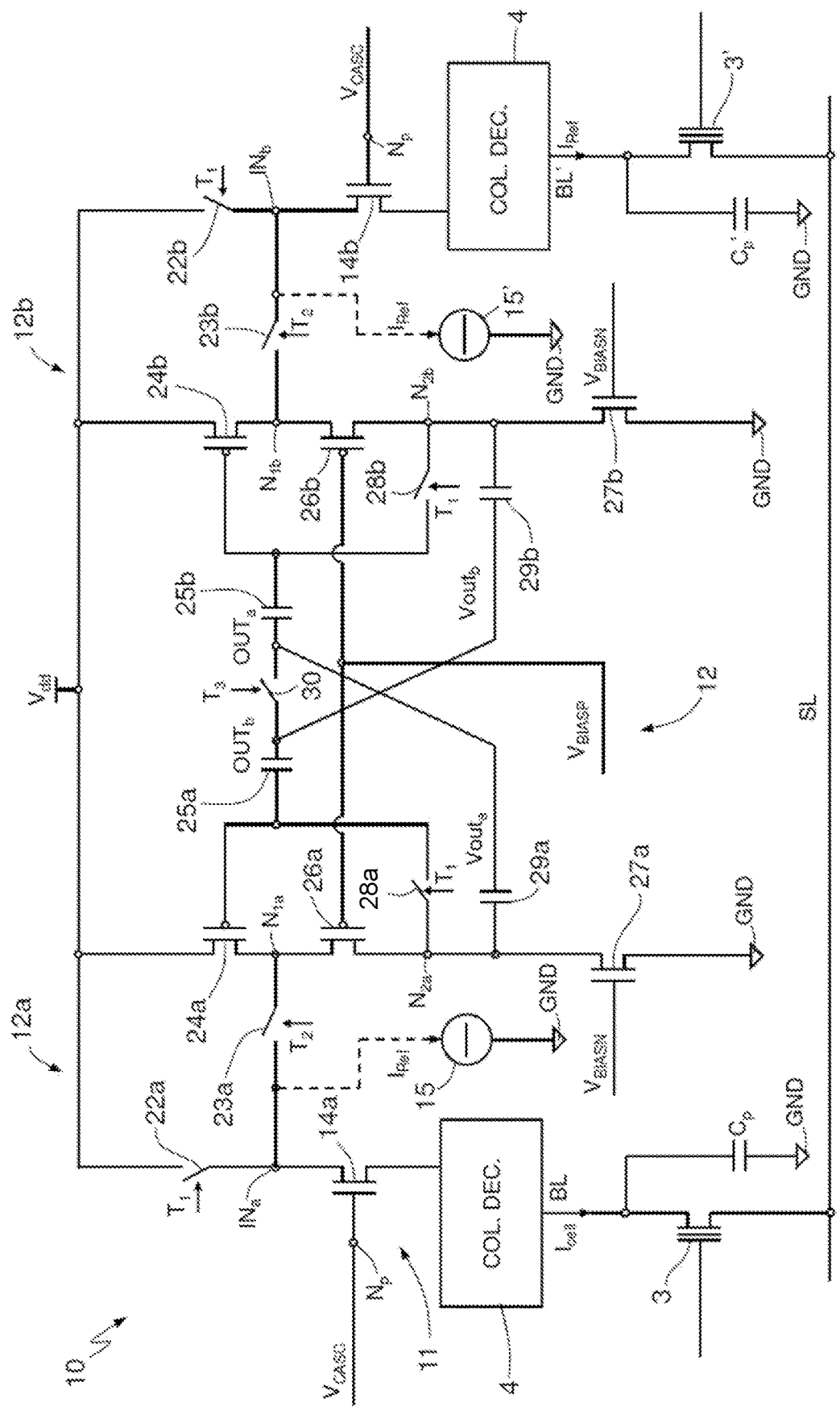
FIG. 4 shows a second circuit implementation, of a known type, of the reading circuit.

With reference to FIG. 4, a description is now made of a further embodiment, of a known type, of the current-to-voltage converter stage 12 of the reading circuit 10. This embodiment, which is described in detail in patent application No. EP 3 174 200 A1 and in the corresponding patent No. U.S. Pat. No. 9,627,011, filed in the name of the present Applicant, further enables a compensation of the offsets possibly present in the reading circuit 10, due to an unbalancing between the first and second circuit branches 12a, 12b.

The current-to-voltage converter stage 12 of the reading circuit 10 again comprises one circuit branch 12a, 12b for each of the bit lines BL, BL'. For simplicity of illustration, the circuit branch 12a associated to the bit line BL is here described in detail (altogether similar considerations apply, however, to the circuit branch 12b associated to the bit line BL'; note that the circuit elements of the first circuit branch 12a are in general identified with the suffix 'a', whereas the circuit elements of the second circuit branch 12b are in general identified with the suffix 'b').

The circuit branch 12a in this case comprises:
a first switch 22a, connected between the first comparison input $IN_a$ and the supply input and controlled for opening/closing by a first control signal $T_1$;
a second switch 23a, connected between the first comparison input $IN_a$ and a first internal node $N_{1a}$ and controlled for opening/closing by a second control signal $T_2$;
a first latch transistor 24a, in the example of a pMOS type, having a first conduction terminal connected to the supply input and a second conduction terminal connected to the first internal node $N_{1a}$, and a control terminal connected to the second output terminal $OUT_b$ by the interposition of a first compensation capacitor 25a (note that, likewise, the first latch transistor 24b of the second circuit branch 12b, has a control terminal connected to the first output terminal $OUT_a$ through a respective first compensation capacitor 25b);
a second latch transistor 26a, which in the example is of a pMOS type, having a first conduction terminal connected to the first internal node $N_{1a}$, a second conduction terminal connected to a second internal node $N_{2a}$, and a control terminal receiving a first biasing voltage $V_{BIASP}$;
a third latch transistor 27a, in the example of an nMOS type, having a first conduction terminal connected to the second internal node $N_{2a}$, a second conduction terminal connected to the ground terminal GND, and a control terminal receiving a second biasing voltage $V_{BIASN}$;
a third switch 28a, connected between the second internal node $N_{2a}$ and the control terminal of the first latch transistor 24a and controlled for opening/closing by the first control signal $T_1$; and
a second compensation capacitor 29a, connected between the second internal node $N_{2a}$ and the first output terminal $OUT_A$ (note that, likewise, the second compensation capacitor 29b of the second circuit branch 12b, is connected to the second output terminal $OUT_b$).

Also in this case, the latch transistors of the first and second circuit branches 12a, 12b jointly implement a latch block aimed at maintaining at the output a voltage representing the datum stored, during the step of reading of the memory cell 3.

The current-to-voltage converter stage 12 of the reading circuit 10 further comprises a coupling switch 30 connected between the first and second output terminals $OUT_a$, $OUT_b$ and controlled by a third control signal $T_3$, which corresponds to the first control signal $T_1$, appropriately delayed.

In the case of single-ended reading (for example, for verifying the datum stored in the direct and complementary memory cells 3, 3'), each circuit branch 12a, 12b may have a respective reference-current generator 15, 15', connected, in the embodiment illustrated, between the first, or second, comparison input $IN_a$, $IN_b$ and the ground terminal GND.

Operation of the reading circuit 10 also envisages in this case a first precharging step, during which the first switch 22a is controlled in a closing state by the first control signal $T_1$, and the second switch 23a is controlled in an opening state by the second control signal $T_2$. In this way, a precharging current path is created, starting from the supply voltage $V_{dd}$, through the aforesaid first switch 22a and the biasing transistor 14a, for charging the parasitic capacitance $C_p$ coupled to the bit line BL (likewise, for charging the parasitic capacitance $C_p'$ for the bit line BL', in the case of differential reading).

Furthermore, the third switch 28a is switched to the closed state (by the same first control signal $T_1$) and the coupling switch 30 is further switched into the closed state (by the third control signal $T_3$).

In this step, the differences (due, for example, to mismatch of the components) between the output voltages $V_{outa}$, $V_{outb}$ of the first and second circuit branches 12a, 12b are stored in the compensation capacitors 25a, 29a (25b, 29b) via storage of an electrical compensation charge.

Next, the first switch 22a, 22b of both circuit branches 12a, 12b is switched to the open state (by the first control signal $T_1$). Further, the third switch 28a, 28b of both circuit branches 12a, 12b is switched to the open state, while the coupling switch 30 remains in the closed state (for an appropriate time interval). In this way, the electrical offset-compensation charge remains stored in the compensation capacitors 25a, 29a (25b, 29b).

Subsequently, the second switch 23a, 23b of the circuit branches 12a, 12b is switched to the closed state. In this way, precharging through the biasing transistors 14a, 14b is interrupted, and the voltage at the drain terminals of the biasing transistors 14a, 14b starts to discharge through the cell reading current $I_{cell}$ and the reference reading current $I_{ref}$.

In the subsequent step of effective reading of the datum stored in the memory cell 3, the coupling switch 30 is switched to the open state, by the third control signal $T_3$ (the switching state of the other switches remains, instead, unchanged with respect to the previous operating step).

In this operating step, the two circuit branches 12a, 12b define a respective regenerative amplification loop, closed on a capacitive path defined by the respective compensation capacitors 25a, 29a (25b, 29b). This regenerative amplification loop is unbalanced with respect to the metastable state reached in the previous operating step, exclusively by the difference between the cell reading current $I_{cell}$ and the reference reading current $I_{ref}$.

Due to unbalancing of the circuit branches 12a, 12b, the output voltages $V_{outa}$, $V_{outb}$ evolve in an opposite direction. For instance, if $I_{cell}>I_{ref}$, then $V_{outa}<V_{outb}$ (and thus Sout='1'); and if $I_{cell}<I_{ref}$, then $V_{outa}>V_{outb}$ (and thus Sout='0').

This embodiment enables improvement of the reading operation, thanks to the possibility of detecting and storing the offsets present in the current-to-voltage converter stage 12 in a step preliminary to the step of effective reading of the datum stored, and in particular the voltage offset ΔV, defined as unbalancing (for example, due to mismatch in the values of the circuit components) between the amplified voltages of the first and second circuit branches 12a, 12b.

The present Applicant has realized that known reading circuits 10 of the type described previously have certain problems, which may prove particularly important in the case of memory devices 1 having high-density memory arrays 2, i.e., a large number of memory cells 3 and, accordingly, a large number of sense-amplifier circuits 10 coupled to the corresponding bit lines BL, BL'.

As discussed previously, during operation of each sense amplifier 10, currents are injected into the source lines SL, thus generating, on account of the intrinsic resistance of the same source lines, corresponding voltage drops. Especially in the case of particularly resistive source lines SL, as in technologies characterized by high density and reduced size of the memory cells 3, such voltage drops may reach even significant values, for example in the region of 100-150 mV.

In particular, the present Applicant has realized that the value of these voltage drops on the source lines SL varies according to whether reading is performed in differential, or single-ended mode.

In fact, in the case of differential reading, there may be current injection both by the direct memory cell 3 and the associated bit line BL and by the complementary memory cell 3' and the associated bit line BL'.

Instead, in the case of single-ended reading, there is at most a current injection into the source lines SL by just the direct memory cells 3 (no current injection may also occur, depending on the relation between the cell current $I_{cell}$ and the reference current $I_{ref}$).

Voltage differences even in the order of hundreds of millivolts may therefore arise on the source line SL in the different operating conditions, with the consequence that the cell current $I_{cell}$ (the value of which depends also on the voltage present on the source line SL, i.e., on the source terminal of the transistor that defines the same memory cell 3) may vary even by 10%-15%, according to whether reading is differential or single-ended.

It is evident that such differences in the value of the cell current $I_{cell}$ may cause problems in proper execution, for example, of the reading and verifying operations. As mentioned previously, in fact, there are memory architectures in which reading of the datum is of a differential type (carried out between a direct cell 3 and a complementary cell 3'), whereas verification of the read datum is carried out in single-ended mode, i.e., with respect to a reference current $I_{ref}$.

Figure 5:
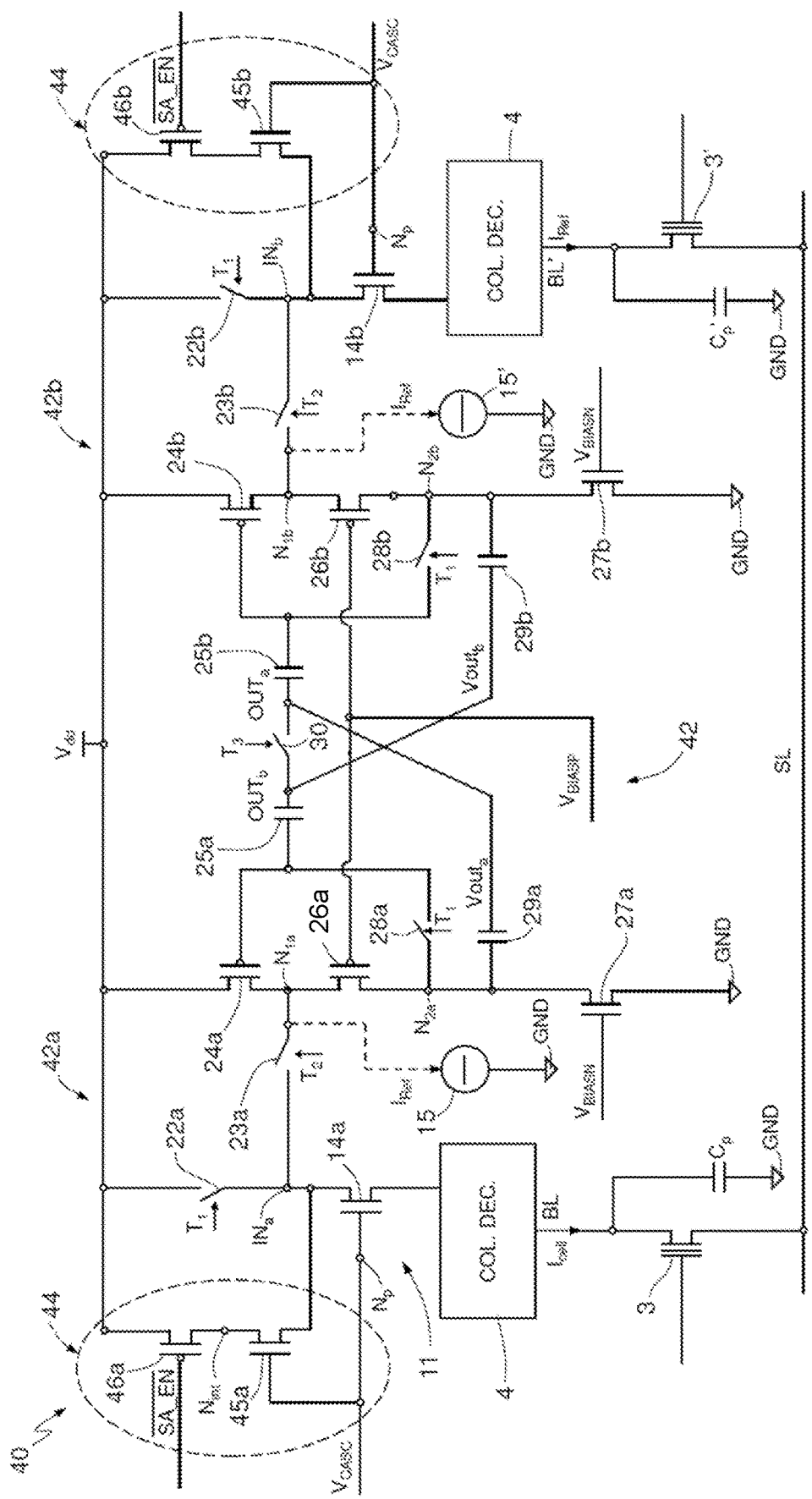
FIG. 5 shows a circuit implementation of a reading circuit, according to a first embodiment of the present solution.

An embodiment of the present invention will now be described. In detail, FIG. 5 shows a reading circuit, here designated by 40, in which the corresponding current-to-voltage converter stage, here designated by 42, comprises a current-injection module 44. The current-to-voltage converter stage 42 is altogether equivalent to what is illustrated with reference to FIG. 4 and is not described again herein in detail (the same reference numbers as the ones used previously are further adopted to designate the same circuit elements).

The current-injection module 44 comprises, for each of the circuit branches, here designated by 42a, 42b, an injection transistor 45a, 45b, in the embodiment illustrated of an nMOS type, having a first conduction terminal, in particular the source terminal, connected to the first comparison input $IN_a$, respectively, the second comparison input $IN_b$, a second conduction terminal, in particular the drain terminal, connected to an intermediate node $N_{int}$, designed to be selectively coupled to the supply input, and a control terminal, in particular the gate terminal, which is connected to the biasing node $N_p$ and receives the biasing voltage $V_{case}$ (note that the control terminal of the injection transistor 45a, 45b is thus connected to the control terminal of the corresponding biasing transistor 14a, 14b of the biasing stage 11 of the reading circuit 10).

In the embodiment illustrated in FIG. 5, the current-injection module 44 further comprises, for each circuit branch 42a, 42b, an enabling transistor 46a, 46b, in the example of a pMOS type, having a first conduction terminal connected to the intermediate node $N_{int}$ and to the respective injection transistor 45a, 45b, a second conduction terminal connected to the supply input, from which it receives the supply voltage $V_{dd}$, and a control terminal, which receives, in the example, the negated version $\overline{SA\_EN}$ of a read-enable signal SA_EN.

The aforesaid read-enable signal SA_EN is indicative of the enabling of the reading operation carried out by the sense-amplifier circuit 40. Consequently, the aforesaid enabling transistor 46a, 46B is in a closed (or conduction) state for the entire duration of the reading operation, which includes the steps of precharging, equalization, and effective reading previously described in detail. Advantageously, the presence of the enabling transistor 46a, 46b prevents phenomena of conduction of static current, i.e., current paths from the supply.

Figure 6:
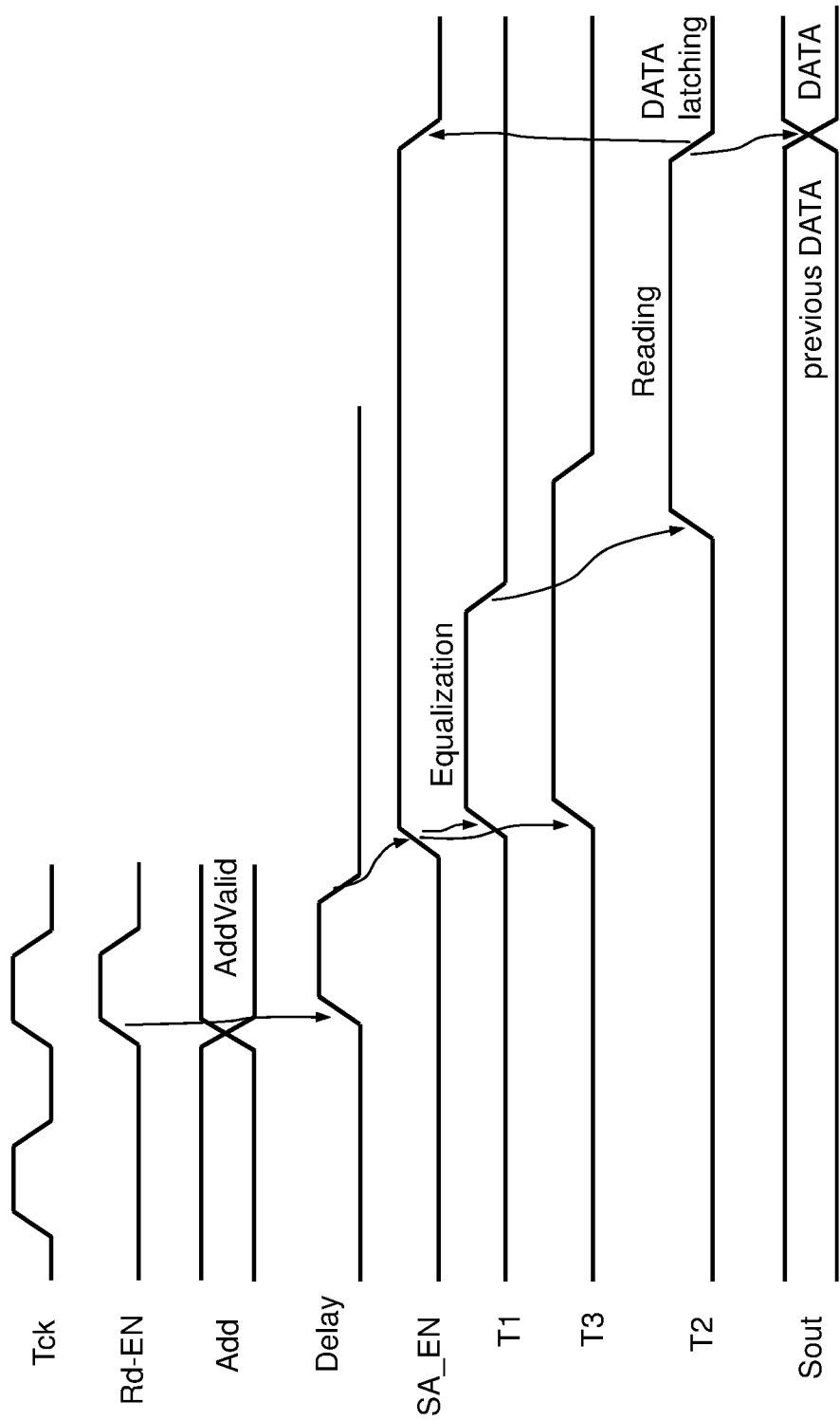
FIG. 6 shows time plots of electrical quantities associated to the reading circuit of FIG. 5.

FIG. 6 shows the plot of the control signals that determine the duration and sequence of the steps of the reading operation, which is in general timed by the transitions of a clock signal $T_{ck}$.

Start of the reading operation is determined by a read-start signal Rd_EN, which determines start of a delay interval Delay, of appropriate duration, so as to ensure the presence of a valid address ADD for addressing of the memory cells 3, 3'. At the end of the delay interval Delay, the read-enable signal SA_EN switches to the high value, and this switching further determines switching to the high value of the first control signal $T_1$ and of the third control signal $T_3$ (the duration of which is appropriately delayed) so as to determine the precharging step and the subsequent equalization step. Switching to the low value of the first control signal $T_1$ then determines starting of the effective reading step, and switching to the high value of the second control signal $T_2$. The end of the effective reading step leads to switching to the low value of the read-enable signal SA_EN and latching of the datum at the output, the value of which is represented by the digital output signal $S_{out}$.

A detailed description of the operation of the current-injection module 44 is now presented.

During the precharging step, when the first control signal $T_1$ is in the high state and the first switch 22a is closed, the source terminal of the injection transistor 45a, 45b is at the supply voltage $V_{dd}$. Consequently, the injection transistor 45a, 45b is in the open (non-conduction) state, hence not having any influence on the operation of the reading circuit (and not determining any current injection) for both of the circuit branches 42a, 42b.

When the first control signal $T_1$ switches into the low state and the first switch 22a is open, the injection transistor 45a, 45b is in any case kept in the open state, and the biasing transistor 14a, 14B is biased in a saturation condition. The value of the first biasing voltage $V_{BIASP}$ is in fact chosen so that the voltage at the first internal node $N_{1a}$, $N_{1b}$ (coinciding with the voltage at the source terminal of the second latch transistor 26a, 26b) is sufficiently high to prevent the biasing transistor 14a, 14b from operating in a linear condition. In this way, it is ensured that the injection transistor 45a, 45b will not supply current during the step of precharging of the bit lines.

Next, once one of the two memory cells, either the direct cell 3 or the complementary cell 3' (or the corresponding reference-current generator 15, 15'), conducts current, the voltage of the source terminal of the injection transistor 45a (or else 45b) drops, determining its conduction.

In particular, considering for example that, due to unbalancing of the latch block, the first latch transistor 24a of the first circuit branch 42a is open and the first latch transistor 24b of the second circuit branch 42b is closed, the injection transistor 45b of the second circuit branch 42B is kept off, consequently not contributing to any current injection. Instead, the voltage at the first internal node $N_{1a}$ of the first circuit branch 42a drops, until the corresponding biasing transistor 14a enters the linear region and the injection transistor 45a of the first circuit branch 42a turns on, entering into the conduction state. From this moment onwards, the injection transistor 45a determines injection of current into the bit line BL and the source line SL at the first circuit branch 42a.

Basically, the current-injection module 44 intervenes, in this case at the first circuit branch 42a, at the moment in which passage of current through the first circuit branch 42a is bound to be interrupted, by carrying out injection into the source line SL of a current of an appropriate value.

Figure 7A:
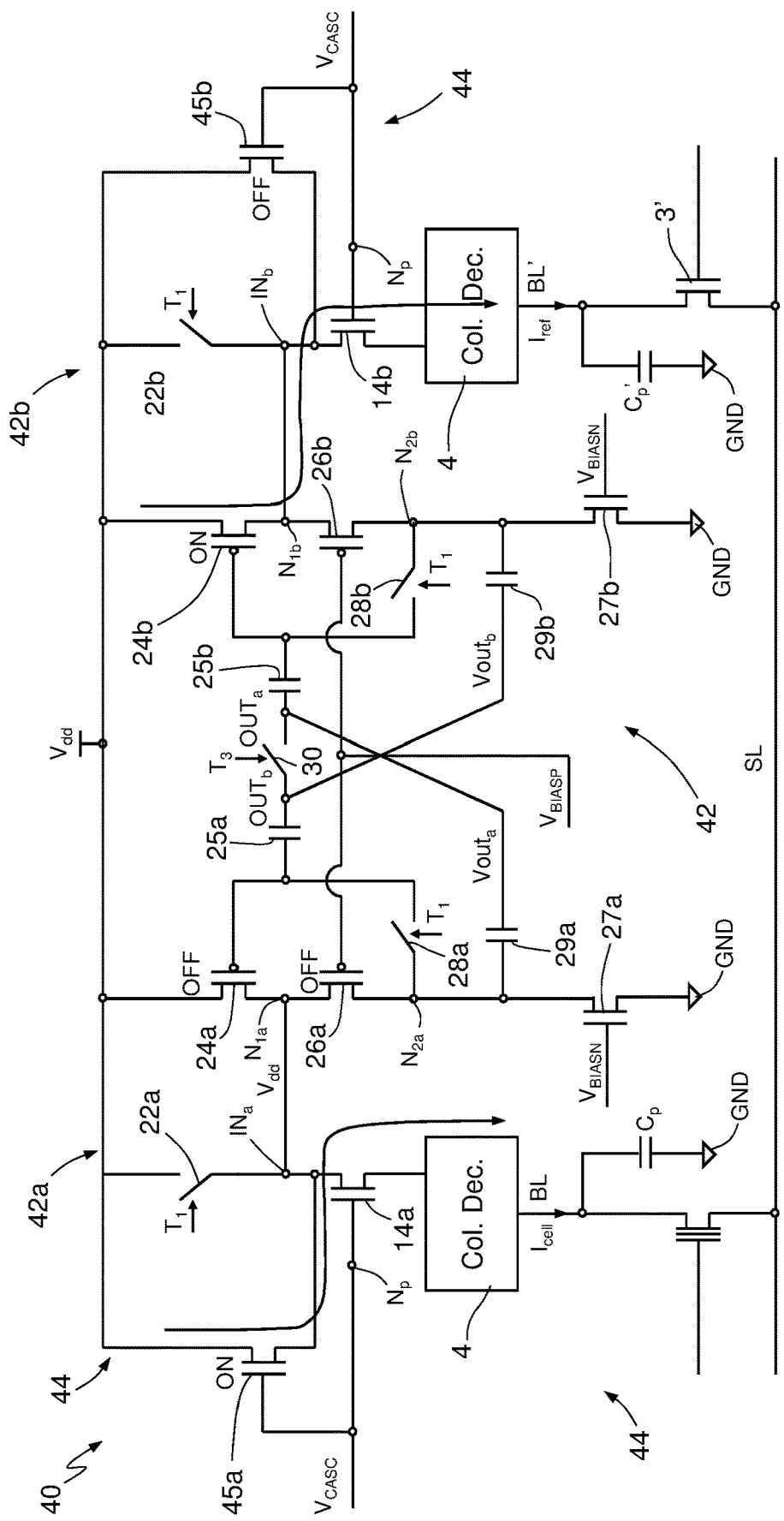
FIGS. 7A-7C show respective configurations of the reading circuit of FIG. 5, in different operating reading conditions.

FIG. 7A shows the circuit configuration of the reading circuit 40, at the end of the effective reading step when, that is, unbalancing has by now occurred, in the case of reading of a differential type and assuming that the cell current $I_{cell}$ is higher than the reference current $I_{ref}$.

In particular, the arrows indicate the path of the currents that are injected into the source line SL, which circulate: at the first circuit branch 42a, through the injection transistor 45a (note that the enabling transistor 46a is represented as a short circuit, given that it is in the closed, or conduction, state) and through the biasing transistor 14a; and at the second circuit branch 42b, through the first latch transistor 24b (which is, as mentioned previously, in the closed state) and through the biasing transistor 14b.

Basically, in this operating condition, there is a current injection into the source line SL from both circuit branches 42a, 42b and by both the direct memory cell 3 and the complementary memory cell 3'.

Figure 8A:
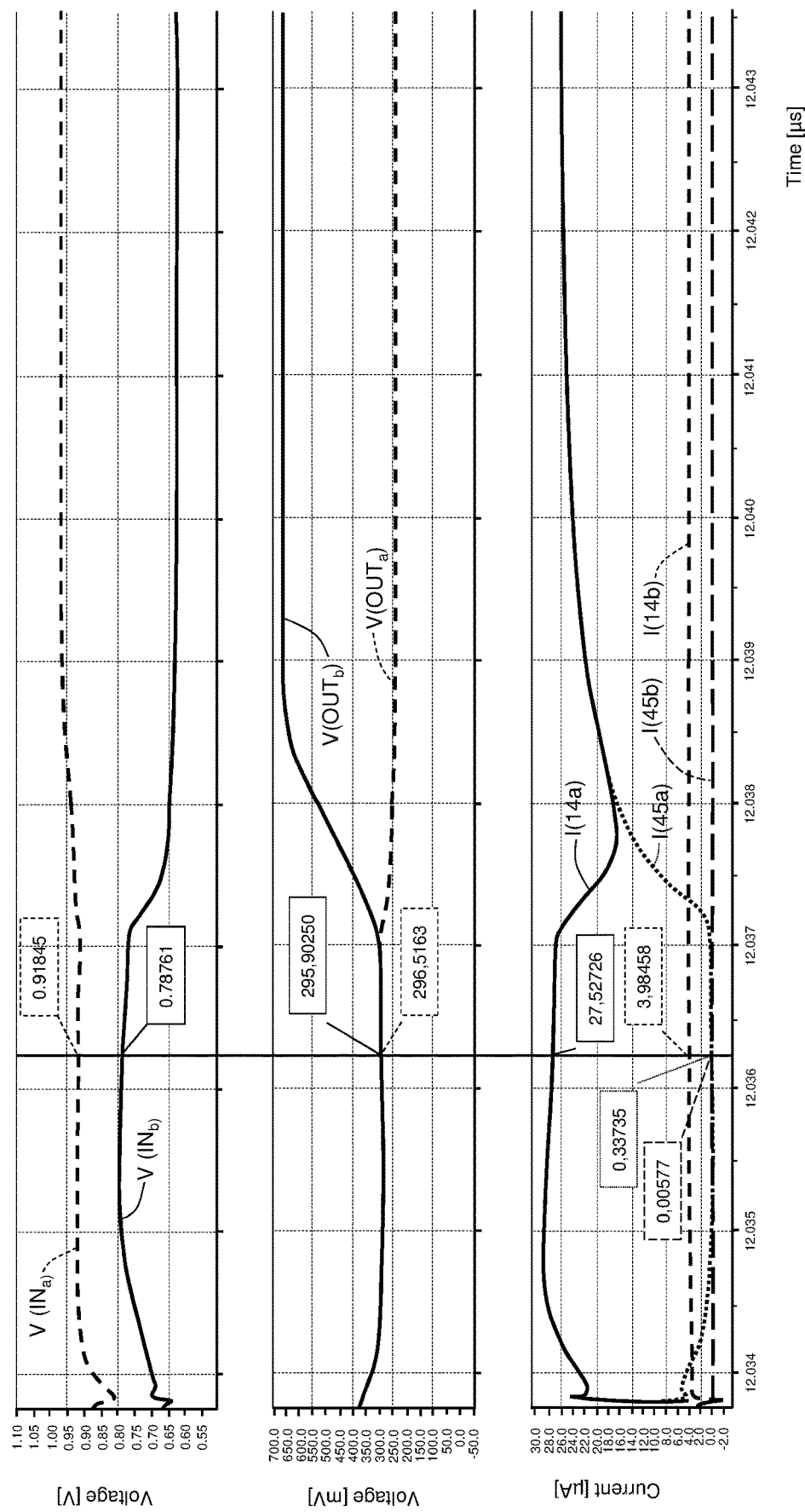
FIGS. 8A-8C show time plots of electrical quantities associated to the circuit configurations of FIGS. 7A-7C.

FIG. 8A shows the time plot of the most representative voltage and current signals during the reading operation and for the operating condition illustrated in FIG. 7A, and in particular: the voltages on the first and second comparison inputs, denoted by $V(IN_a)$ and $V(IN_b)$; the first and second output voltages $V_{outa}$, $V_{outb}$; the currents that flow through the injection transistor in the first and second circuit branches 42a, 42b, denoted by $I(45_a)$ and $I(45_b)$; and the currents that flow through the biasing transistor in the first and second circuit branches 42a, 42b, denoted by $I(14_a)$ and $I(14_b)$.

Of particular note is the fact that the current injected into the source line SL by the first circuit branch 42a is supplied entirely by the current-injection transistor 45a of the current-injection module 44, at the end of the reading step, as well as the fact that the same current substantially determines the value of the total current injected into the source line SL.

Figure 7B:
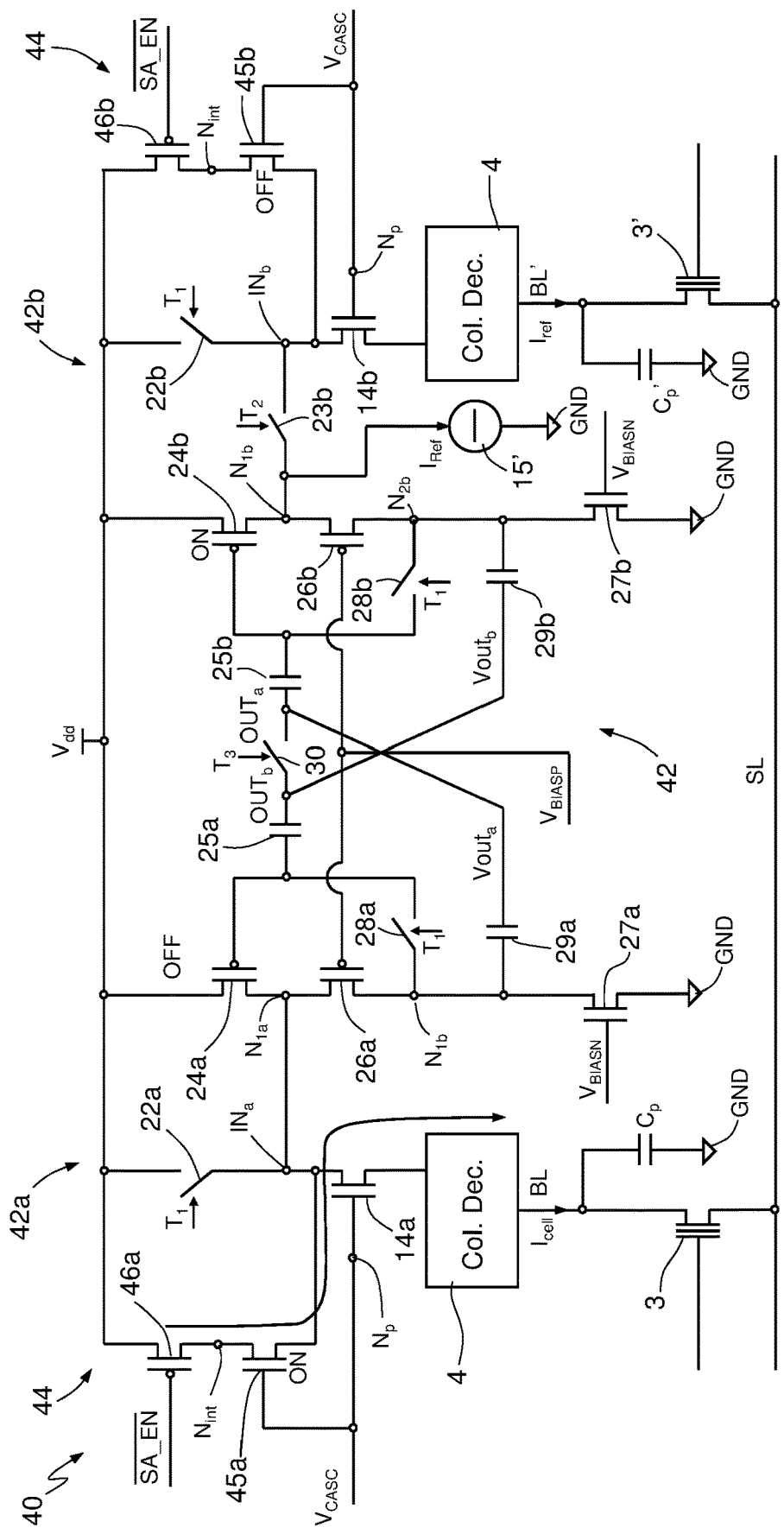

FIG. 7B shows the circuit configuration of the reading circuit 40 in the case of reading of a single-ended type (for example, for a verify operation of the datum programmed in the memory cell 3, which is assumed as having a high cell current $I_{cell}$, higher than the reference current $I_{ref}$ i.e., with a datum to be verified corresponding to a logic '1'), on the hypothesis that the reference current $I_{ref}$ is supplied by a current generator 15' on the second circuit branch 42b (the second switch 23b of the second circuit branch 42B is in this case always kept open by the second control signal $T_2$, which in this case has a specific value for the second circuit branch 42b).

Also in this case, the arrow indicates the path of the current that is injected into the source line SL, once unbalancing between the circuit branches 42a, 42b has occurred at the end of the effective reading step, on the hypothesis that the verification operation yields a positive outcome, in so far as $I_{cell} > I_{ref}$.

In this case, the current circulates towards the source line SL only at the first circuit branch 42a, through the injection transistor 45a of the current-injection module 44 (note that the enabling transistor 46a is still in the closed or conduction state) and through the biasing transistor 14a. At the second circuit branch 42b there is a current path through the first latch transistor 24*b*, in the closed state, and through the current generator 15' towards the ground terminal GND. There is hence no current injection (if not for substantially negligible values) into the source line SL, in the same second circuit branch 42*b*.

Figure 8B:
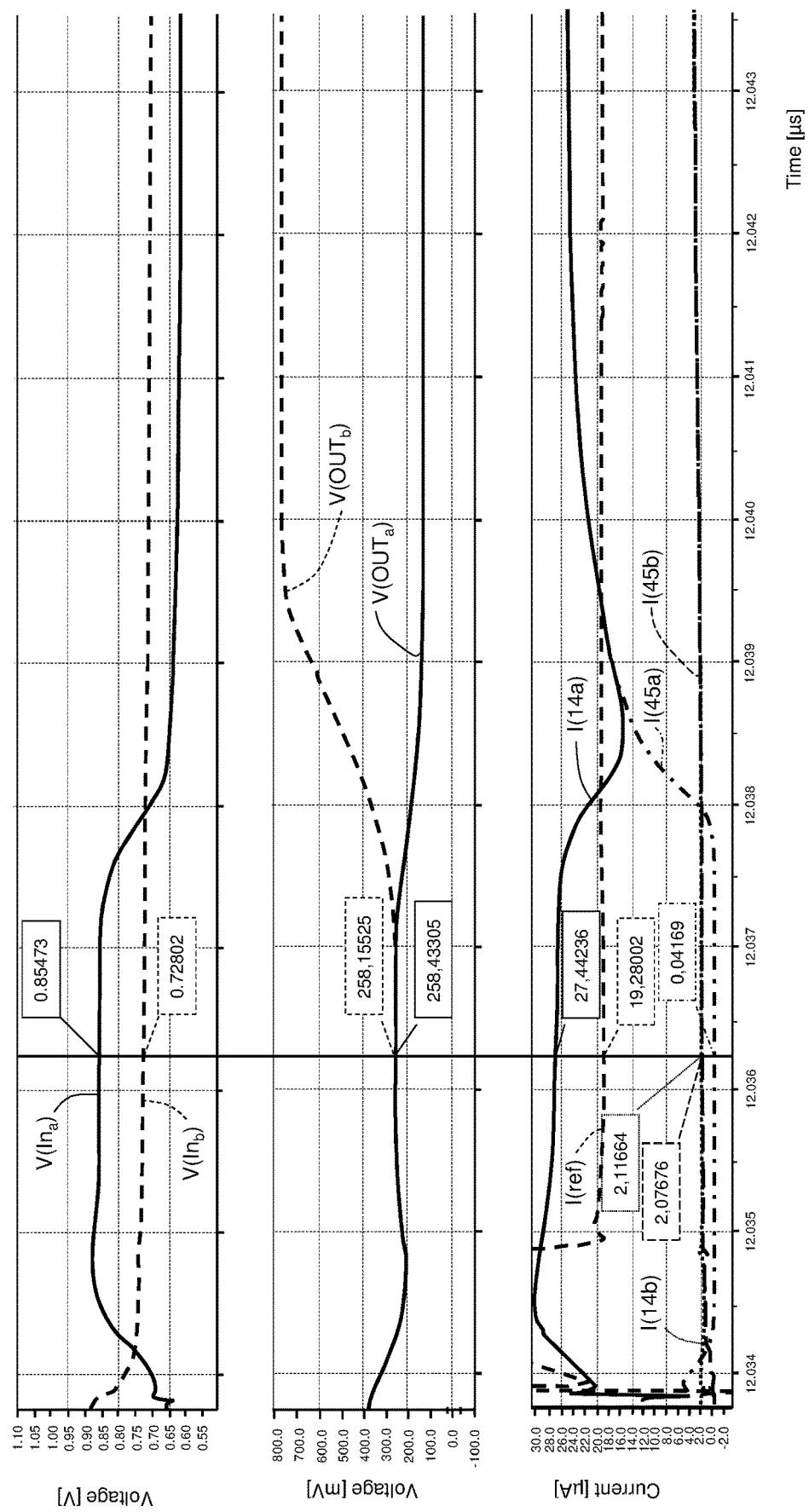

FIG. 8B shows also in this case the time plot of the most representative voltage and current signals during the reading operation and for the operating condition represented in FIG. 7B; as compared to FIG. 7A, the reference current $I_{ref}$ supplied by the reference-current generator 15' is further shown.

It may be noted, in particular, that the current injected into the source line SL is in this case supplied substantially entirely by the current-injection transistor 45*a* of the current-injection module 44. In other words, in the absence of the aforesaid current-injection module 44 there would not occur a substantial current injection into the same source line SL in this operating condition. Consequently, also in this case, the current-injection module 44 intervenes, at the first circuit branch 42*a*, by carrying out injection into the source line SL of a current of an appropriate value, when the passage of current through the first circuit branch 42*a* is bound to be interrupted. Furthermore, also in this case, the current supplied by the current-injection module 44 substantially determines the value of the total current injected into the source line SL.

Figure 7C:
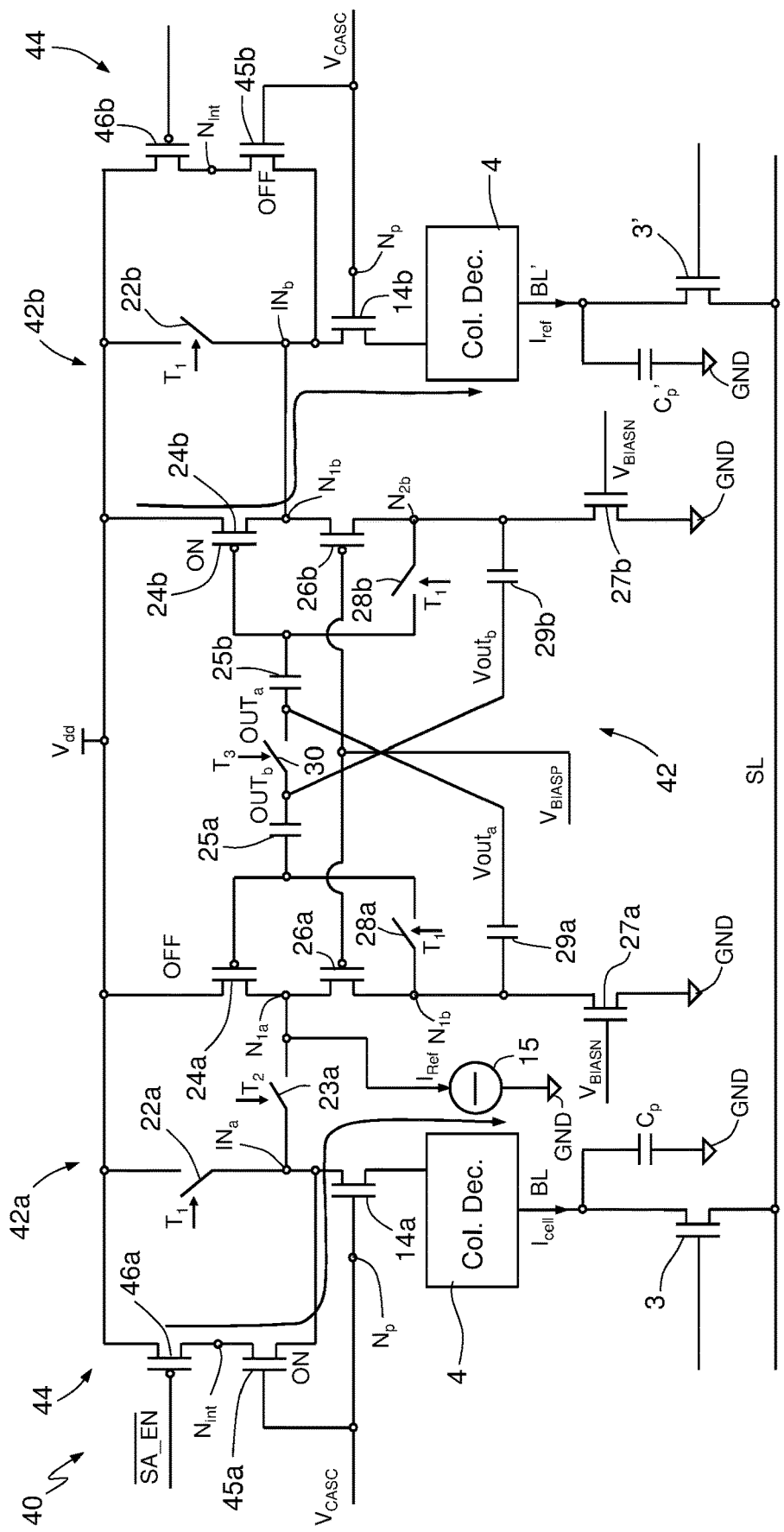

FIG. 7C shows the circuit configuration of the reading circuit 40, also in this case for reading of a single-ended type, this time for a verification of the datum contained in the complementary memory cell 3' associated to the second circuit branch 42*b* with respect to a reference-current generator 15 coupled to the first circuit branch 42*a*, assuming that the cell current $I_{cell}$ is low (the datum to be verified corresponds to a logic '0'). The second switch 23*a* of the first circuit branch 42*a* is in this case always kept open by the second control signal $T_2$, which is specific for the first circuit branch 42*a*.

Also in this case, the arrows indicate the path of the currents that are injected into the source line SL, once the unbalancing between the circuit branches 42*a*, 42*b* has occurred at the end of the effective reading step, assuming that the verification operation yields a positive outcome, in so far as $I_{ref} > I_{cell}$.

Once again, the current circulates in the first circuit branch 42*a*, through the injection transistor 45*a* of the current-injection module 44 and through the biasing transistor 14*a*, towards the source line SL. At the second circuit branch 42B there is a current path through the first latch transistor 24*b*, in a closed state, through the second switch 23*b*, which is also in a closed state, and through the biasing transistor 14*b*, towards the source line SL.

Figure 8C:
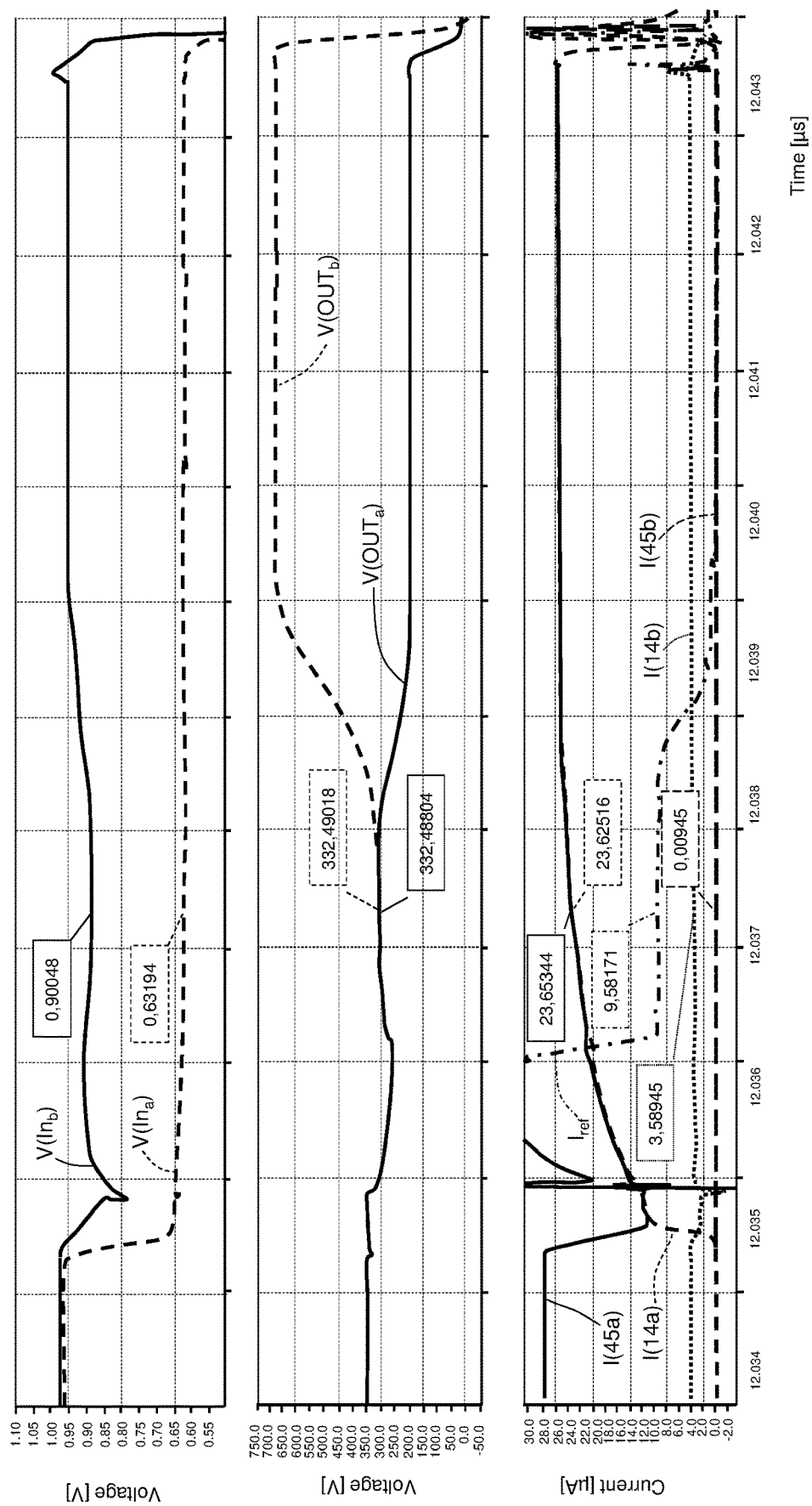

Also in this case, FIG. 8C shows the time plot of the most representative voltage and current signals, during the reading operation and for the operating condition illustrated in FIG. 7C.

It should be noted in particular that the current injected into the source line SL is again supplied substantially only by the current-injection transistor 45*a* of the current-injection module 44. Also in this case, therefore, the current-injection module 44 intervenes on the first circuit branch 42*a* by carrying out injection into the source line SL of a current of an appropriate value, when the passage of current through the same first circuit branch 42*a* is bound to be interrupted.

Although not illustrated in detail, it will be clear that the operation of the current-injection module 44 is altogether similar in the case of reading of a datum of high logic value ('1') in the complementary memory cell 3' associated to the bit line BL'. In this case, it is in fact the injection transistor 44*b* associated to the second circuit branch 42*b* that intervenes to inject an appropriate current into the source line SL, substantially determining the voltage drop that occurs on the same source line SL.

The advantages of the solution proposed are clear from the foregoing description.

In any case, it is again underlined that the solution described prevents variations of the voltage on the source line SL during the reading operations, in particular according to whether reading is differential or single-ended.

In fact, the current-injection module 44 intervenes so that substantially a same value of current is injected into the source line SL in the various operating conditions, in particular both in the case of differential reading and in the case of single-ended reading, thus keeping the voltage drop on the source line SL (and, consequently, the value of the cell current $I_{cell}$) substantially unaltered.

The above advantages are particularly important for high-density memory devices, having a large number of memory cells, with particularly reduced dimensions, and particularly resistive source lines SL (which consequently give rise to significant voltage drops as a result of the current injected).

Finally, it is clear that modifications and variations may be made to what has been described and illustrated herein, without thereby departing from the scope of the present invention, as defined in the annexed claims.

In particular, it is underlined that the solution described may be applied also for different circuit configurations of the reading circuit.

Figure 9:
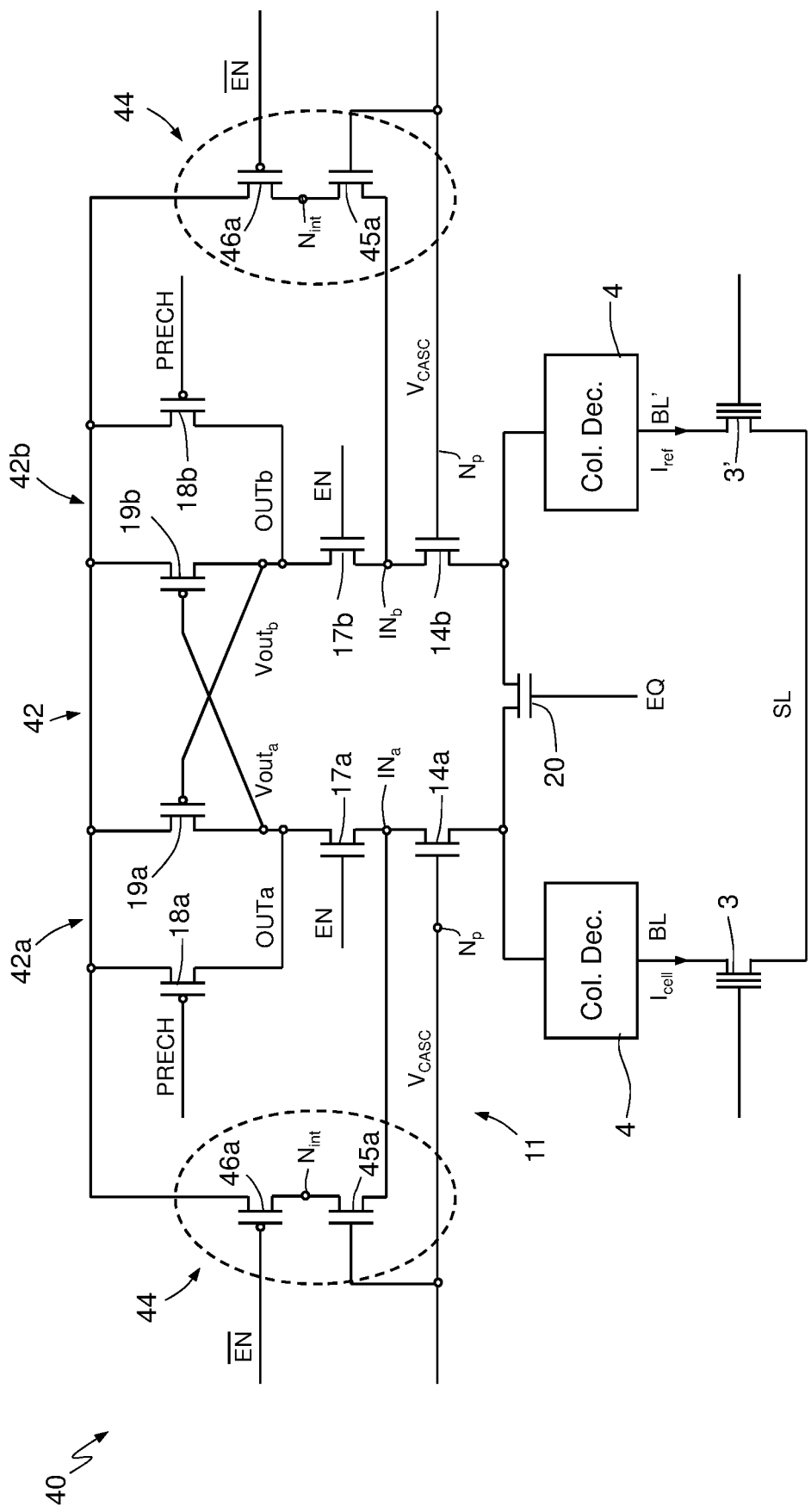
FIG. 9 shows a different circuit implementation of the reading circuit, according to a second embodiment of the present solution.

In particular, FIG. 9 shows the current-injection module 44, applied to a current-to-voltage converter stage 42, which, in this case, is altogether equivalent to what has been illustrated with reference to FIG. 3 (consequently the same reference numbers as the ones used previously are here adopted to designate the same circuit elements).

The current-injection module 44 also in this case comprises, for each circuit branch 42*a*, 42*b*, the injection transistor 45*a*, 45*b* and the enabling transistor 46*a*, 46*b*.

The injection transistor 45*a*, 45*b*, of an nMOS type, also in this case has a first conduction terminal, in particular the source terminal, connected to the first comparison input $IN_a$, a second conduction terminal, in particular the drain terminal, connected to an intermediate node $N_{int}$, and a control terminal, in particular the gate terminal, which is connected to the biasing node $N_p$ and receives the biasing voltage $V_{case}$ (note that the control terminal of the injection transistor 45*a*, 45*b* is connected to the control terminal of the corresponding biasing transistor 14*a*, 14*b*).

The current-injection module 44 further comprises, for each circuit branch 42*a*, 42*b*, the enabling transistor 46*a*, 46*b*, in the example of a pMOS type, having a first conduction terminal connected to the intermediate node $N_{int}$ and to the respective injection transistor 45*a*, 45*b*, a second conduction terminal connected to the supply input, from which it receives the supply voltage $V_{dd}$, and a control terminal, which in this case receives the negated version $\overline{EN}$ of the enable signal EN.

Finally, it is emphasized that the solution described may be advantageously applied to several different non-volatile memory devices, and several different embodiments of the corresponding memory cells, for example being of the phase-change-memory (PCM) type.

What is claimed is:

1. A sense-amplifier circuit for a non-volatile memory device that includes a memory array with memory cells arranged in word lines and bit lines and coupled to respective source lines, the sense-amplifier circuit comprising:
- a first circuit branch coupled to a first comparison input;
- a second circuit branch coupled to a second comparison input;
- a first biasing transistor arranged between a bit line associated with the memory cell and the first comparison input, the first biasing transistor having a control terminal coupled to a biasing node configured to receive a biasing voltage;
- a second biasing transistor arranged between a reference bit line and the second comparison input, the second biasing transistor having a control terminal coupled to the biasing node, wherein the reference bit line is associated with a complementary memory cell in a differential reading operation or from a reference current generator in a single-ended reading operation;
- a current-injection circuit coupled to the first and second comparison inputs, wherein the current-injection circuit comprises:
  - a first injection transistor having a first conduction terminal coupled to the first comparison input, a second conduction terminal selectively coupled to a supply voltage node, and a control terminal coupled to the biasing node, and
  - a second injection transistor having a first conduction terminal coupled to the second comparison input, a second conduction terminal selectively coupled to the supply voltage node, and a control terminal coupled to the biasing node;
- wherein, during a reading step for reading a datum stored in a memory cell, the first circuit branch is configured to receive a cell current from the bit line;
- wherein, during the reading step, the second circuit branch is configured to receive a reference current from the reference bit line;
- wherein the first circuit branch and the second circuit branch are configured to generate, during the reading step, a first output voltage at a first output terminal and a second output voltage at a second output terminal, the first and second output voltages being a function of a difference between the cell current and the reference current; and
- wherein the current-injection circuit is configured to cause an injection of current into a source line associated with the memory cell and the complementary memory cell, the injected current being substantially uniform in the differential and in the single-ended reading operations.

2. The sense-amplifier circuit according to claim 1, wherein the current-injection circuit is configured to cause an injection of current into the source line following upon the reading step when there is no current path through the first circuit branch or the second circuit branch.

3. The sense-amplifier circuit according to claim 1, wherein the current-injection circuit further comprises:
- a first enabling transistor arranged between the supply voltage node and the first injection transistor, the first enabling transistor having a control terminal coupled to receive a read-enable signal; and
- a second enabling transistor arranged between the supply voltage node and the second injection transistor, the second enabling transistor having a control terminal coupled to receive the read-enable signal.

4. The sense-amplifier circuit according to claim 3, wherein the first and second injection transistors are nMOS transistors and the first and second enabling transistors are pMOS transistors.

5. The sense-amplifier circuit according to claim 3, wherein the first and second biasing transistors are configured to bias the bit line and the reference bit line to precharge the bit line and reference bit line in a precharging step of the reading operation, prior to the reading step; and
- wherein the read-enable signal has a first logic value for the entire duration of the precharging step and the step of reading of the datum, and a second logic value at the end of the reading step.

6. The sense-amplifier circuit according to claim 1, wherein the sense-amplifier circuit is configured so that the first and second injection transistors are biased in an off-state during a precharging step and are biased in an on-state at the end of the reading step.

7. The sense-amplifier circuit according to claim 6, wherein the first and second circuit branches comprise:
- a first switch element arranged between the supply voltage node and the first comparison input;
- a second switch element arranged between the supply voltage node and the second comparison input;
- a latch configured to be unbalanced during the reading step as a function of the difference between the cell current and the reference current and to generate the first and second output voltages as a result of the unbalancing; and
- a third switch element arranged between the first comparison input and the latch; and
- a fourth switch element arranged between the second comparison input and the latch;
- wherein the first and second switch elements are controlled in a closed state during the precharging step and in an open state during the reading step; and
- wherein the third and fourth switch elements are controlled in an open state during the precharging step and in a closed state during the reading step.

8. The sense-amplifier circuit according to claim 7, wherein the latch comprises:
- a first latch transistor arranged between the supply voltage node and a first internal node coupled to the third switch element; and
- a second latch transistor arranged between the first internal node and a second internal node, the second latch transistor having a control terminal coupled to receive a biasing voltage having a value to keep the first injection transistor biased in the off-state during the precharging step;
- a third latch transistor arranged between the supply voltage node and a second internal node coupled to the fourth switch element; and
- a fourth latch transistor arranged between the second internal node and a second internal node, the second latch transistor having a control terminal coupled to receive the biasing voltage.

9. The sense-amplifier circuit according to claim 8, wherein the reference current generator is coupled between the first internal node and a ground-reference terminal, and wherein the second switch element is controlled in the open state during the entire duration of the single-ended reading operation.

10. The sense-amplifier circuit according to claim 8, wherein the first and second circuit branches further comprise:
- a first compensation capacitor arranged between the control terminal of the first latch transistor and the second output terminal;

a second compensation capacitor arranged between the control terminal of the second latch transistor and the first output terminal;
a third compensation capacitor arranged between the second internal node and the first output terminal; and
a fourth compensation capacitor arranged between the second internal node and the second output terminal.

11. The sense-amplifier circuit according to claim 10, further comprising a fifth switch element coupled between the first output terminal and the second output terminal.

12. A non-volatile memory device comprising:
a memory array having a plurality of memory cells; and
a sense-amplifier circuit according to claim 1 coupled to the memory array, the sense-amplifier circuit configured to implement both a different-ended read operation and a single-ended read operation to read datum stored in the memory cells of the memory array.

13. A sense-amplifier circuit comprising:
a first comparison input;
a second comparison input;
a first biasing transistor arranged between a bit line and the first comparison input, the first biasing transistor having a control terminal coupled to a biasing node;
a second biasing transistor arranged between a reference bit line and the second comparison input, the second biasing transistor having a control terminal coupled to the biasing node;
a first injection transistor having a first conduction terminal coupled to the first comparison input, a second conduction terminal, and a control terminal coupled to the biasing node;
a second injection transistor having a first conduction terminal coupled to the second comparison input, a second conduction terminal, and a control terminal coupled to the biasing node;
a first enabling transistor arranged between a supply voltage node and the second conduction terminal of the first injection transistor, the first enabling transistor having a control terminal coupled to receive a read-enable signal;
a second enabling transistor arranged between the supply voltage node and the second conduction terminal of the second injection transistor, the second enabling transistor having a control terminal coupled to receive the read-enable signal;
a first switch element arranged between the supply voltage node and the first comparison input;
a second switch element arranged between the supply voltage node and the second comparison input;
a third switch element coupled to the first comparison input and a first output terminal;
a fourth switch element coupled to the second comparison input and a second output terminal;
a first latch transistor arranged between the supply voltage node and a first internal node coupled to the third switch element;
a second latch transistor arranged between the first internal node and a second internal node, the second latch transistor having a control terminal coupled to receive a biasing voltage;
a third latch transistor arranged between the supply voltage node and a second internal node coupled to the fourth switch element; and
a fourth latch transistor arranged between the second internal node and a second internal node, the second latch transistor having a control terminal coupled to receive the biasing voltage.

14. The circuit according to claim 13, further comprising a reference current generator coupled between the first internal node and a ground-reference terminal.

15. The circuit according to claim 13, further comprising:
a first compensation capacitor arranged between the control terminal of the first latch transistor and the second output terminal;
a second compensation capacitor arranged between the control terminal of the second latch transistor and the first output terminal;
a third compensation capacitor arranged between the second internal node and the first output terminal; and
a fourth compensation capacitor arranged between the second internal node and the second output terminal.

16. A method for reading a non-volatile memory device having a memory array with memory cells arranged in word lines and bit lines and coupled to respective source lines, the method during a reading step of a datum stored in a memory cell comprising:
receiving a cell current from a bit line associated with the memory cell and a reference current, the reference current from a reference bit line associated with a complementary memory cell in a differential reading operation and from a current-reference generator in a single-ended reading operation;
generating a first output voltage and a second output voltage that are a function of a difference between the cell current and the reference current; and
causing an injection of current into a source line associated with the memory cell and with the complementary memory cell, the injection current being substantially uniform in the differential and single-ended reading operations.

17. The method according to claim 16, further comprising biasing the bit line and the reference bit line of the memory array in order to precharge the bit line and the reference bit line in a precharging step prior to the reading step.

18. The method according to claim 16, wherein causing the injection of current comprises causing a substantially constant voltage drop, by a resistive effect, on the source line in the differential and single-ended reading modes.

19. A method of operating a sense-amplifier circuit, the method comprising:
during a differential-ended reading operation, receiving a first cell current from a bit line associated with a memory cell;
during the differential-ended reading operation, receiving a first reference current from a reference bit line associated with a complementary memory cell;
during the differential-ended reading operation, generating a first output voltage at a first output terminal and a second output voltage at a second output terminal, the first and second output voltages being a function of a difference between the first cell current and the first reference current;
during a single-ended reading operation, receiving a second cell current from a bit line associated with the memory cell;
during the single-ended reading operation, receiving a second reference current from a reference current generator;
during the single-ended reading operation, generating a third output voltage at the first output terminal and a fourth output voltage at the second output terminal, the third and fourth output voltages being a function of a difference between the second cell current and the second reference current; and causing an injection of current into a source line associated with the memory cell and the complementary memory cell, the injected current being substantially uniform in the differential and in the single-ended reading operations.

20. The method according to claim 19, further comprising biasing the bit line and the reference bit line to precharge the bit line and reference bit line in a precharging step.

* * * * *